United States Patent [19]
Shimura et al.

[11] Patent Number: 5,705,880
[45] Date of Patent: Jan. 6, 1998

[54] PIEZOELECTRIC DEVICE

[75] Inventors: Takashi Shimura, Toyama; Kenichi Nishimoto, Toyama-Ken; Masanari Nishikigawa, Matsumoto; Takashi Hosoe, Toyama; Masaaki Tutiya, Nagano-Ken; Hirohide Yoshino, Toyama-Ken; Manabu Sumita; Takeshi Yamazaki, both of Toyama; Sigeo Ojima, Toyama-Ken; Sadayuki Kato, Takefu, all of Japan

[73] Assignee: Murata Manufacturing Co., Ltd., Nagaokakyo, Japan

[21] Appl. No.: 457,760

[22] Filed: Jun. 1, 1995

[30] Foreign Application Priority Data

Jun. 27, 1994 [JP] Japan ..................... 6-144516

[51] Int. Cl.⁶ ..................................... H03H 9/52
[52] U.S. Cl. ................ 310/366; 310/348; 310/352; 333/189; 333/192
[58] Field of Search ..................... 310/344, 348, 310/352, 353, 365, 366; 333/186, 189, 192

[56] References Cited

U.S. PATENT DOCUMENTS

| | | | |
|---|---|---|---|
| 4,353,045 | 10/1982 | Matsui et al. | 310/348 |
| 4,398,162 | 8/1983 | Nagai | 333/189 |
| 4,656,385 | 4/1987 | Tanaka | 310/348 |
| 5,057,802 | 10/1991 | Ozeki et al. | 310/348 |
| 5,272,595 | 12/1993 | Mura et al. | 361/772 |
| 5,274,529 | 12/1993 | Mura et al. | 361/679 |
| 5,392,012 | 2/1995 | Iwata et al. | 333/189 |
| 5,394,123 | 2/1995 | Inoue et al. | 333/189 |
| 5,525,944 | 6/1996 | Oyama | 310/348 |
| 5,565,824 | 10/1996 | Nagano | 310/348 |

*Primary Examiner*—Thomas M. Dougherty
*Attorney, Agent, or Firm*—Armstrong, Westerman, Hattori, McLeland & Naughton

[57] ABSTRACT

An electronic device which has piezoelectric resonators and terminals piled in a box-like case. The electronic device has a couple of terminals, each of which has a contact portion and a junction portion extending from the contact portion. In the case, the couple of terminals are integrated by electrically connecting the junction portions.

3 Claims, 4 Drawing Sheets

1

PIEZOELECTRIC DEVICE

BACKGROUND OF THE INVENTION

1. Field of the Invention

The present invention relates to a piezoelectric device, and more particularly to a piezoelectric device which is used in an oscillation circuit, a filter circuit or the like.

2. Description of Related Art

There has been a well-known type of electronic device which has piezoelectric resonators and terminals piled in a box-like case. The terminals include four kinds, an input terminal, an output terminal, a grounding terminal and a junction terminal which is drawn around in the case.

The junction terminal is U-shaped, and therefore, it is not simple to insert the piezoelectric resonators and the terminals in the case. Accordingly, for automation of assembly of the electronic device, a machine of a complicate structure is required.

SUMMARY OF THE INVENTION

An object of the present invention is to provide an electronic device of a structure which facilitates insertion of piezoelectric resonators and terminals in a case.

In order to attain the object, an electronic device according to the present invention has a couple of junction terminals, each of which has a contact portion and a junction portion extending from the contact portion. The respective junction portions of the junction terminals are electrically connected, and thereby, the junction terminals are integrated.

Since the junction terminals are separate components before insertion thereof into a case, the junction terminals can be handled as the other terminals and piezoelectric resonators. After the insertion into the case, the junction portions of the junction terminals are electrically connected, and the integrated junction terminals function as a convention U-shaped junction terminal.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

Preferred embodiments of the present invention are described with reference to the accompanying drawings. The embodiments are electronic devices used as ladder filters. The same parts and members used in the embodiments are provided with the same reference symbols.

First Embodiment; FIGS. 1–4

Figure 1:
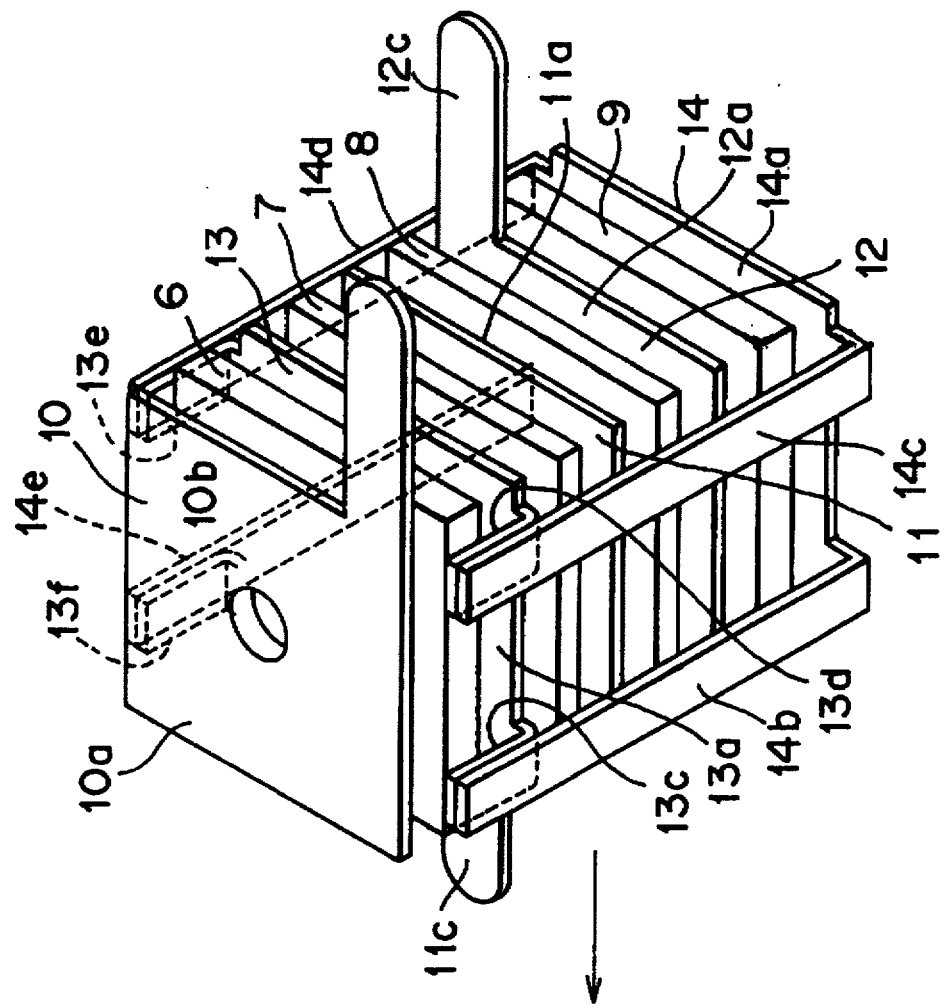
FIG. 1 is a perspective view of an electronic device which is a first embodiment of the present invention, showing assembly thereof.
Figure 1:
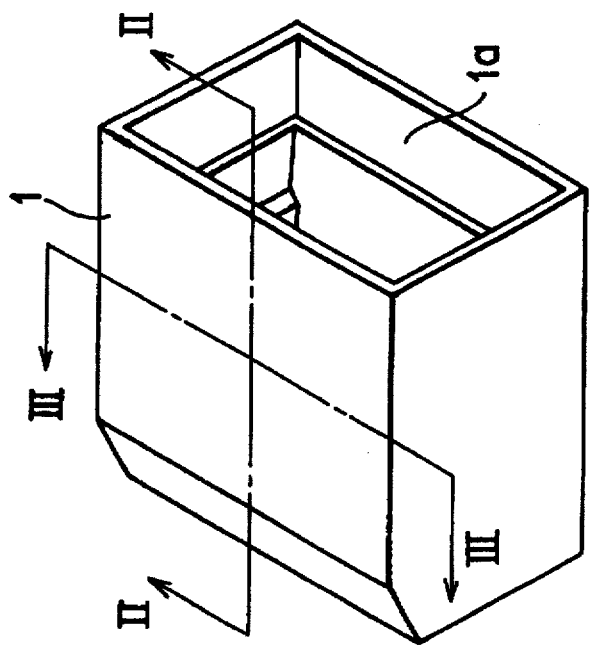
Figure 2:
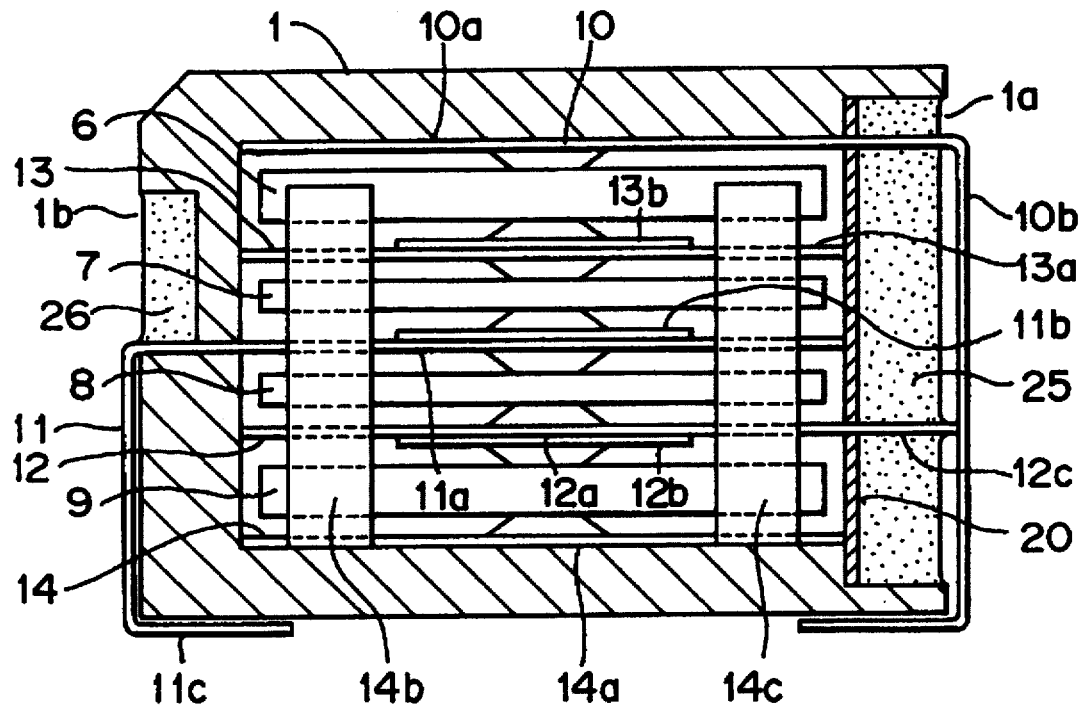
FIG. 2 is a sectional view of the electronic device of FIG. 1, taken along the line II—II.
Figure 3:
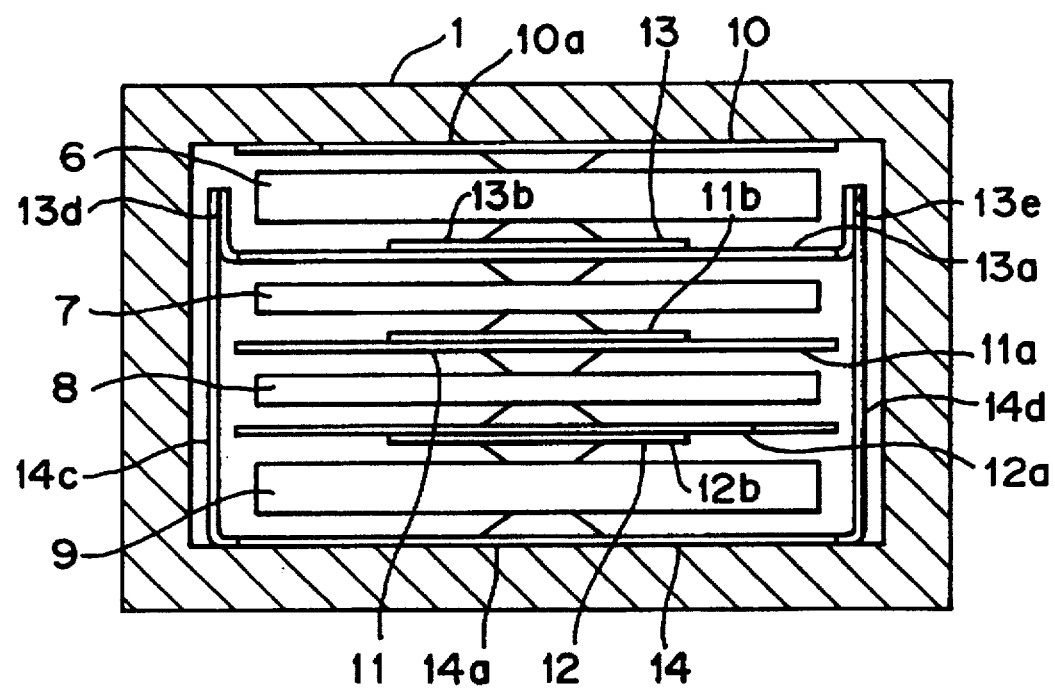
FIG. 3 is a sectional view of the electronic device of FIG. 1, taken along the line III—III.

As shown in FIGS. 1 through 3, a ladder filter of a first embodiment comprises a case 1, four piezoelectric resonators 6, 7, 8 and 9, an input terminal 10, a grounding terminal 11, an output terminal 12 and a couple of junction terminals 13 and 14. The piezoelectric resonators 6 through 9 are of a conventional type which has oscillation electrodes on both surfaces.

The case 1 has openings 1a and 1b on mutually opposite sides. The terminals 10 and 12 are partly protruded from the opening 1a, and the terminal 11 is partly protruded from the opening 1b.

The input terminal 10 has a contact portion 10a and an external connecting portion 10b. The contact portion 10a has a projection, and the projection is in contact with an upper surface of the piezoelectric resonator 6.

The grounding terminal 11 has contact portions 11a and 11b which are folded on each other and an external connecting portion 11c. A projection provided on the contact portion 11a is in contact with an upper surface of the piezoelectric resonator 8, and a projection provided on the contact portion 11b is in contact with a lower surface of the piezoelectric resonator 7.

The output terminal 12 has contact portions 12a and 12b which are folded on each other and an external connecting portion 12c. A projection provided on the contact portion 12a is in contact with a lower surface of the piezoelectric resonator 8, and a projection provided on the contact portion 12b is in contact with an upper surface of the piezoelectric resonator 9.

The junction terminal 13 has contact portions 13a and 13b which are folded on each other and junction portions 13c, 13d, 13e and 13f. A projection provided on the contact portion 13a is in contact with an upper surface of the piezoelectric resonator 7, and a projection provided on the contact portion 13b is in contact with a lower surface of the piezoelectric resonator 6. The junction portions 13c through 13f extend from the four corners of the contact portion 13a upward perpendicularly to the contact portion 13a.

The other junction terminal 14 has a contact portion 14a and junction portions 14b, 14c, 14d and 14e. A projection provided on the contact portion 14a is in contact with a lower surface of the piezoelectric resonator 9. The junction portions 14b through 14e extend from the four corners of the contact portion 14a upward perpendicularly to the contact portion 14a.

The piezoelectric resonators 6 through 9, and the terminals 10 through 14 are piled outside of the case 1. In this step, since the junction terminals 13 and 14 are separate components, they can be handled in the same manner as the other terminals 10 through 12 and the piezoelectric resonators 6 through 9. Thus, this step is simple and can be automated. In the pile of these components, the junction portions 13c, 13d, 13e and 13f of the terminal 13 are pressed against and electrically in contact with the junction portions 14b, 14c, 14d and 14e of the terminal 14, respectively, and accordingly, the junction terminals 13 and 14 are integrated. The integrated terminals 13 and 14 function as a conventional U-shaped junction terminal. The pile of the piezoelectric resonators 6 through 9 and the terminals 10 through 14 are inserted in the case 1 through the opening 1a. The input and output terminals 10 and 12 protrude the respective external connecting portions 10b and 12c from the case 1 through the opening 1a, and the rounding terminal 11 protrudes the external connecting portion 11c from the case 1 through the opening 1b.

Thereafter, an insulating sheet 20 is set in a step of the opening 1a of the case 1, and the openings 1a and 1b are filled with epoxy resin 25 and 26. Then, when the epoxy resin hardens, the case 1 is sealed. Further, the external connecting portions 10b, 11c and 12c of the terminals 10, 11 and 12 are bent along the sides of the case 1, and thus, the ladder filter is finished as a surface mounting type.

Figure 4:
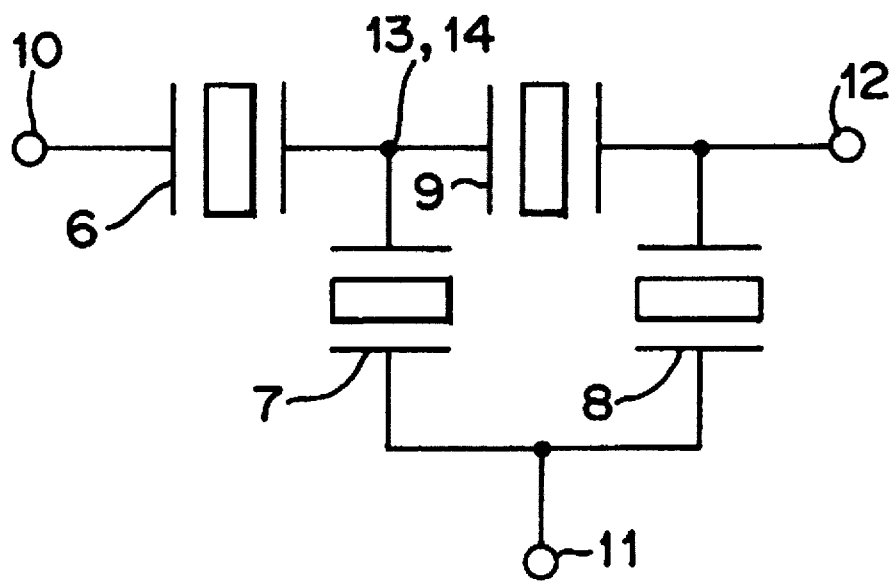
FIG. 4 is an equivalent circuit diagram of the electronic device of the first embodiment.

FIG. 4 shows the electric equivalent circuit of the ladder filter. Between the input terminal 10 and the output terminal 12, the piezoelectric resonators 6 and 9 are electrically connected in series, and the piezoelectric resonators 7 and 8 are connected in parallel.

Figure 5:
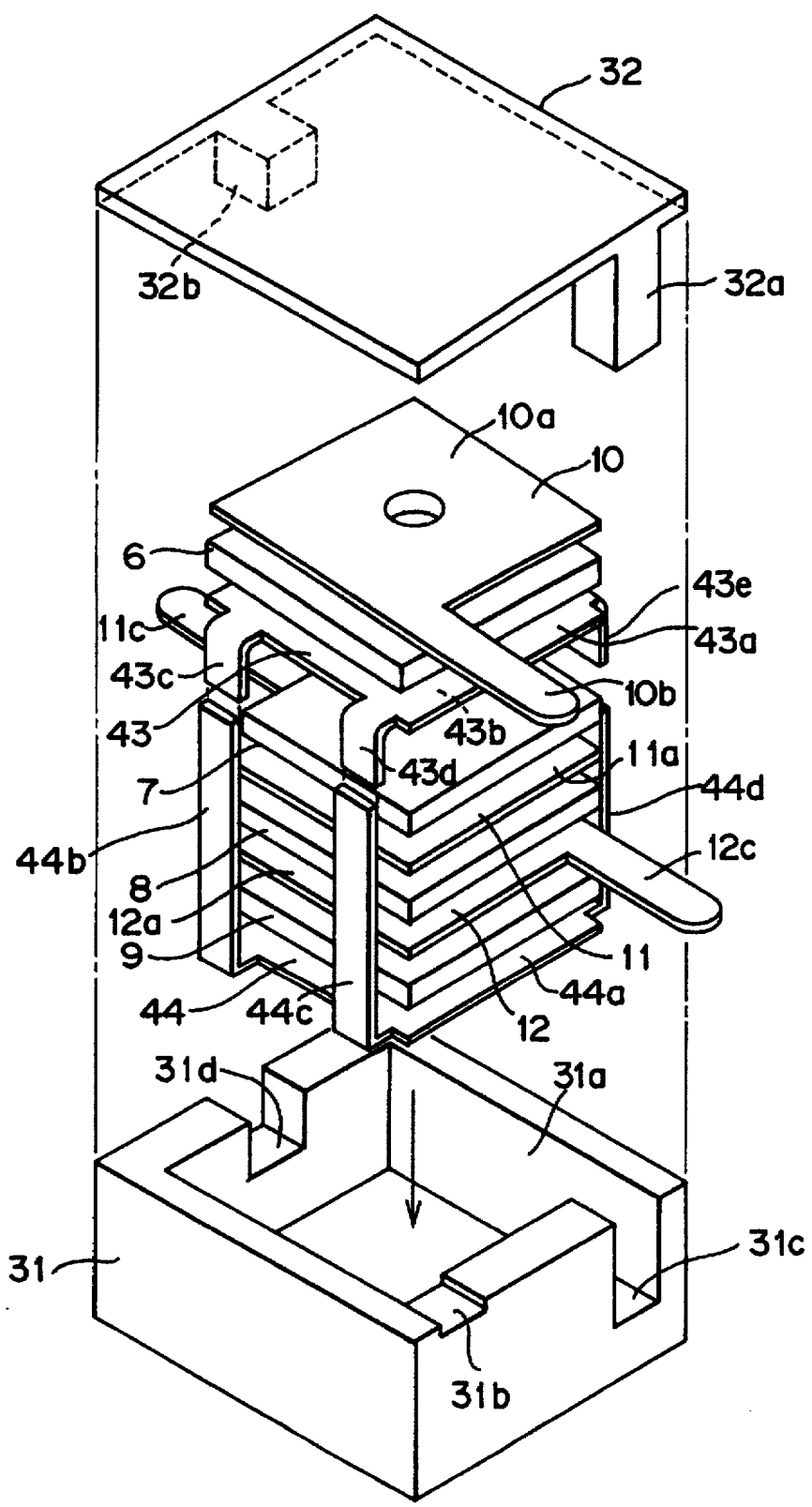
FIG. 5 is a perspective view of an electronic device which is a second embodiment of the present invention, showing assembly thereof.

Second Embodiment: FIG. 5

Referring to FIG. 5, a ladder filter of a second embodiment is described. The ladder filter comprises a case 31, a lid 32, four piezoelectric resonators 6, 7, 8 and 9, and input terminal 10, a grounding terminal 11, an output terminal 12 and a couple of junction terminals 43 and 44. The piezoelectric resonators 6 through 9 and the terminals 10 through 12 are the same as those used in the first embodiment, and a description of these components is omitted.

The case 31 has an opening 31 on an upper side. Grooves 31b and 31c are made in one side of the case 1, and a groove 31d are made in the opposite side of the case 1. The external connecting portions 10b and 12c of the terminals 10 and 12 are protruded from the case 1 through the grooves 31b and 31c, respectively, and the external connecting portion 11c of the terminal 11 is protruded from the case 1 through the groove 31d. The lid 32 has projections 32a and 32b on a lower surface. The projection 32a engages with the groove 31c, and the projection 32b engages with the groove 31d.

The junction terminal 43 has contact portions 43a and 3b which are folded on each other, and four junction portions 43c, 43d, 43e and 43f (although 43f is not seen in FIG. 5). A projection provided on the contact portion 43a is in contact with an upper surface of the piezoelectric resonator 7, and a projection provided on the contact portion 43b is in contact with a lower surface of the piezoelectric resonator 6. The junction portions 43c through 43f extend from the corners of the contact portion 43a downward perpendicularly to the contact portion 43a.

The junction terminal 44 has a contact portion 44a and four junction portions 44b, 44c, 44d and 44e (although 4e is not seen in FIG. 5). A projection provided on the contact portion 44a is in contact with a lower surface of the piezoelectric resonator 9. The junction portions 44b through 44e extend from the corners of the contact portion 44a upward perpendicularly to the contact portion 44a.

The piezoelectric resonators 6 through 9 and the terminals 10 through 12, 43 and 44 are inserted in the case 31 through the opening 31a one by one and are piled in the case 31. In this step, since the junction terminals 43 and 44 are separate components, they are handled as the other terminals 10 through 12 and the piezoelectric resonators 6 and 9. Thus, this step is simple and can be automated. In the case 31, the junction portions 43c, 43d, 43e and 43f of the terminal 43 are pressed against and electrically in contact with the junction portions 44b, 44c, 44d and 44e, respectively, and accordingly, the junction terminals 45 and 44 are integrated.

The integrated terminals 43 and 44 function as a conventional U-shaped junction terminal. By lengthening the junction portions 43c through 43f of the terminal 43, the joint areas (overlapping areas) between the terminals 43 and 44 are enlarged, and thus, a more reliable product can be obtained. The input terminal 10 and the output terminal 12 protrude the respective external connecting portions 10b and 12c from the case 31 through the grooves 31b and 31c. The grounding terminal 11 protrudes the external connecting portion 11c from the case 31 through the groove 31d.

The opening 31a is closed by the lid 32. Then, the external connecting portions 10b, 11c and 12c are bent along sides of the case 31, and the ladder filter is finished as a surface mounting type. This ladder filter has the same advantages as the ladder filter of the first embodiment.

Other Embodiments

In the above embodiments, each of the junction terminals has four junction portions. However, each junction terminal may have any number of junction portions, for example, one junction portion. If the number of junction portions of each junction terminal is so small that the junction terminals cannot be integrated in the structure wherein the junction portions of one junction terminal are pressed against and electrically in contact with those of the other junction terminal, solder, a conductive paste or the like is used for the electrical connection between the junction terminals.

The present invention is applicable to an oscillation circuit, an LC filter, etc. as well as a ladder filter.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A piezoelectric device comprising:

a case which has an opening;

piezoelectric resonators which are inserted in the case through the opening;

an input terminal and an output terminal which are inserted in the case through the opening and hold the piezoelectric resonators; and a pair of junction terminals which are inserted in the case through the opening and hold the piezoelectric resonators, each of the junction terminals having a contact portion and a junction portion extending from the contact portion, the junction terminals being integrated by electrically connecting the respective junction portions, wherein the junction portion of the junction terminals extend upward substantially perpendicularly to the contact portions of the junction terminals.

2. A piezoelectric device as claimed in claim 1, wherein the electronic device is a ladder filter.

3. A piezoelectric device as claimed in claim 1, wherein at least one of the junction terminals has a second contact portion which is folded on the contact portion.

* * * * *